United States Patent
Le Gall et al.

(10) Patent No.: US 7,663,344 B2
(45) Date of Patent: Feb. 16, 2010

(54) METHOD FOR MANAGING A POOL OF RECHARGEABLE BATTERIES ACCORDING TO PRIORITY CRITERIA DETERMINED BASED ON A STATE OF HEALTH OF BATTERIES

(75) Inventors: Murielle Le Gall, Le Chesnay (FR); Daniel Benchetrite, Asnieres-sur-Seine (FR); Olivier Bach, Jouques (FR)

(73) Assignee: Commissariat a l'Energie Atomique, Paris (FR)

( * ) Notice: Subject to any disclaimer, the term of this patent is extended or adjusted under 35 U.S.C. 154(b) by 422 days.

(21) Appl. No.: 11/597,553

(22) PCT Filed: Jun. 6, 2005

(86) PCT No.: PCT/FR2005/001375

§ 371 (c)(1),
(2), (4) Date: Nov. 27, 2006

(87) PCT Pub. No.: WO2006/003287

PCT Pub. Date: Jan. 12, 2006

(65) Prior Publication Data
US 2007/0222418 A1    Sep. 27, 2007

(30) Foreign Application Priority Data
Jun. 14, 2004   (FR)   ................................. 04 06408

(51) Int. Cl.
*H02J 7/00*   (2006.01)
(52) U.S. Cl. ......................... 320/136; 320/134; 324/432

(58) Field of Classification Search ................. 320/124, 320/116, 119, 126, 132, 134, 136; 324/426, 324/432, 434
See application file for complete search history.

(56) References Cited

U.S. PATENT DOCUMENTS

| | | | | |
|---|---|---|---|---|
| 4,849,682 A | * | 7/1989 | Bauer et al. | ................. 320/106 |
| 5,057,762 A | | 10/1991 | Goedken et al. | |
| 5,412,306 A | * | 5/1995 | Meadows et al. | ........... 320/139 |
| 5,436,880 A | * | 7/1995 | Eastman et al. | .......... 369/47.51 |

(Continued)

FOREIGN PATENT DOCUMENTS

EP    0 314 155    5/1989

(Continued)

*Primary Examiner*—Edward Tso
*Assistant Examiner*—Arun Williams
(74) *Attorney, Agent, or Firm*—Oliff & Berridge, PLC

(57) ABSTRACT

The management of a pool of batteries is an intelligent management taking account of the state of health of all the batteries of the pool and of the evolution thereof with time. The method for managing includes determination of priority criteria and charging of a battery selected according to the priority criteria. After the selected battery has been charged, electrical parameters representative of the battery are measured, then the state of health of the selected battery is analyzed according to the measured electrical parameters. The priority criteria are then updated according to the state of health of the battery. Selection of the next battery to be recharged is performed according to the updated priority criteria. The measured parameters used for analyzing the state of health are preferably representative of a coup de fouet effect during a partial discharge of a fully charged battery.

9 Claims, 6 Drawing Sheets

U.S. PATENT DOCUMENTS

| | | |
|---|---|---|
| 5,539,297 A | 7/1996 | Fiebig |
| 5,594,318 A | 1/1997 | Nor et al. |
| 6,255,801 B1 | 7/2001 | Chalasani |
| 6,489,743 B1 | 12/2002 | Alzieu et al. |
| 6,924,622 B1 * | 8/2005 | Anbuky et al. ............. 320/132 |
| 7,253,586 B2 * | 8/2007 | Kangas et al. ............. 320/124 |
| 7,348,763 B1 * | 3/2008 | Reinhart et al. ............ 320/150 |
| 2004/0006440 A1 | 1/2004 | Kim et al. |
| 2004/0085072 A1 | 5/2004 | Kanou et al. |
| 2004/0169491 A1 * | 9/2004 | Heigl et al. ................. 320/124 |

FOREIGN PATENT DOCUMENTS

| | | |
|---|---|---|
| JP | A 10-082843 | 3/1998 |
| JP | A 11-285159 | 10/1999 |
| JP | A 2000-278872 | 10/2000 |

* cited by examiner

METHOD FOR MANAGING A POOL OF RECHARGEABLE BATTERIES ACCORDING TO PRIORITY CRITERIA DETERMINED BASED ON A STATE OF HEALTH OF BATTERIES

BACKGROUND OF THE INVENTION

The invention relates to a method for managing a pool of rechargeable batteries comprising determination of priority criteria, charging of a battery selected according to the priority criteria, and measurement of electrical parameters representative of said battery.

STATE OF THE ART

Numerous installations comprise a large number of rechargeable batteries. The batteries are generally recharged simultaneously or successively so as to keep the latter permanently charged.

U.S. Pat. No. 6,489,743 describes a method for managing an electric power plant, in particular a plant containing batteries connected to solar panels. A regulator controls charging of the batteries so as to charge the latter successively to the maximum, taking account of their state of charge, when the solar energy source is available.

U.S. Pat. No. 5,057,762 and document EP-A-314155 both describe management of the charge of a pool of rechargeable batteries using priority criteria based on the state of charge of the batteries. Priority is given to the battery that is the most charged, so as to rapidly provide a fully charged battery.

Moreover, the capacity of a battery decreases with time, even if the battery is fully charged, and in many applications, in particular in the telecommunications field, a battery is considered to be defective and is replaced when its capacity is less than 80% of its nominal capacity.

U.S. Pat. No. 6,255,801 describes a device whereby the capacity and/or age of a battery can be determined using the electrical parameters, peak voltage and plateau voltage, representative of a coup de fouet effect during partial discharging of the battery. It is thus possible to determine whether a battery is to be replaced without discharging the latter completely.

OBJECT OF THE INVENTION

The object of the invention is to provide a method for managing a pool of batteries that does not present the drawbacks of known systems and, more particularly, a management method enabling optimum use of a pool of batteries.

According to the invention, this object is achieved by the appended claims and more particularly by the fact that the method for managing comprises analysis of the state of health of the selected battery according to said electrical parameters measured after the selected battery has been fully charged, updating of the priority criteria according to the state of health of said battery, and selection of the next battery according to the updated priority criteria.

BRIEF DESCRIPTION OF THE DRAWINGS

Other advantages and features will become more clearly apparent from the following description of particular embodiments of the invention given as non-restrictive examples only and represented in the accompanying drawings, in which.

DESCRIPTION OF PARTICULAR EMBODIMENTS

The method for managing according to the invention can be implemented in a monitoring device by any suitable means and more particularly by means of a microprocessor in which the different steps of the method for managing are programmed.

Figure 1:
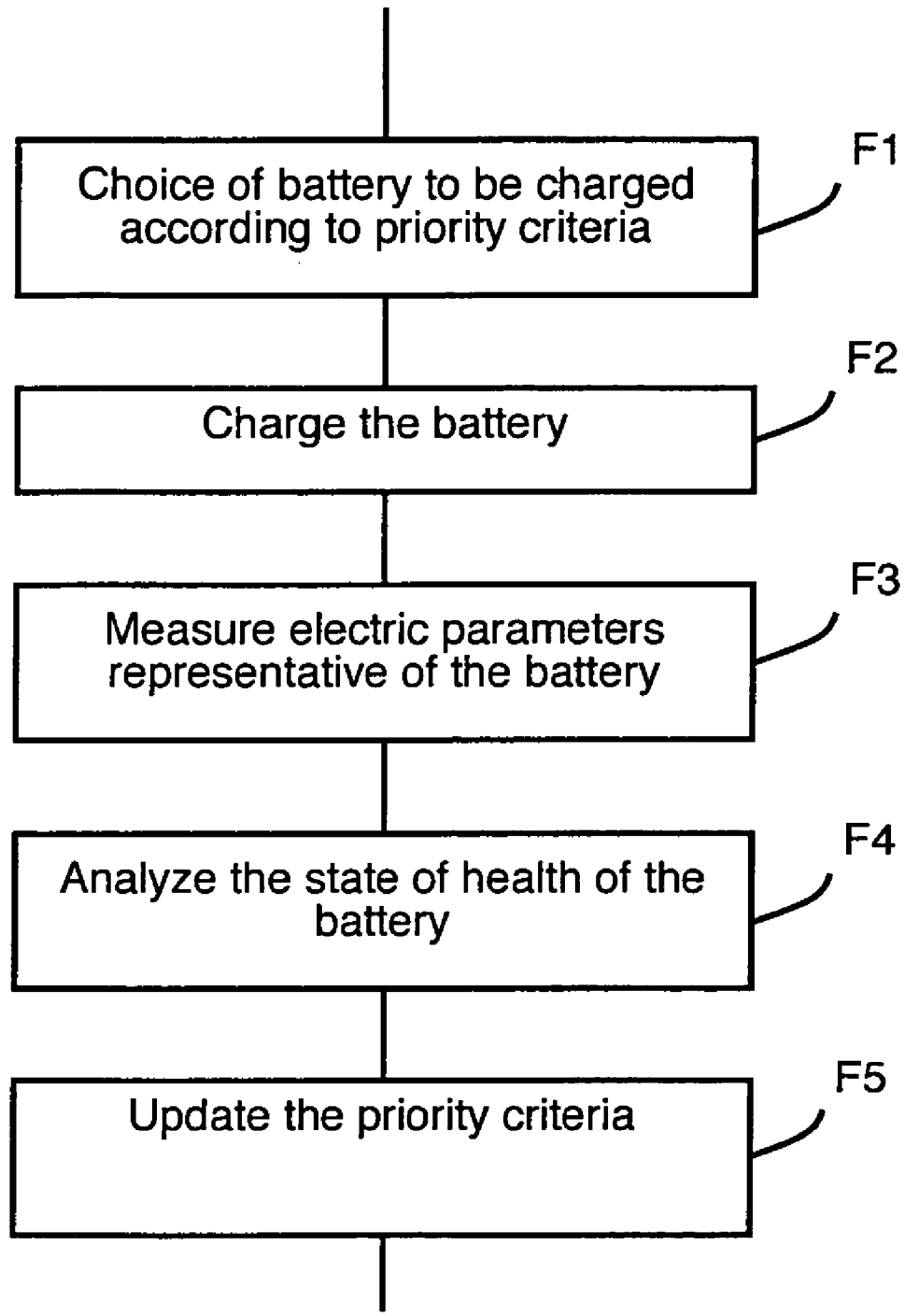
FIG. 1 illustrates a particular embodiment of a method for managing according to the invention in the form of a flowchart.

As represented in the flowchart of FIG. 1, the method for managing according to the invention comprises a step F1 in which the battery to be charged is selected according to predefined priority criteria. Initially, when all the batteries of the pool are new, the batteries are charged successively, one after the other, in any order fixed beforehand and stored in the monitoring device. In this way, all the batteries are charged one after the other before the battery that was charged first is recharged again.

The battery to be charged having been selected, this battery is charged in a step F2. The charging parameters, associated with each battery and dependent in particular on the type of battery used, can be previously stored in the monitoring device and are taken into account automatically during the charge of the selected battery.

When the selected battery is fully charged, electrical parameters representative of the battery and, more particularly of its state of health, are measured in a step F3. These parameters are then analyzed in a step F4 to determine the state of health of the battery. The priority criteria are then updated, if necessary, in a step F5 according to this analysis of the state of health of the selected battery. According to these updated priority criteria, the worse the state of health of a battery, i.e. representative of degradation, the more frequently this battery is recharged. A battery in bad condition will therefore be recharged more frequently than a less degraded battery, itself recharged more frequently than a brand-new battery. After the step F5, another battery is selected, according to the updated priority criteria. This new selected battery is, as before, charged before its state of health is analyzed and, if necessary, the priority criteria are again updated.

Analyzing the state of health of each battery after the latter has been fully recharged enables the different types of degradation liable to affect a battery to be taken into account, degradation in particular linked to phenomena such as sulphation, stratification, corrosion, fall of active material . . . It can take into account not only an irreversible degradation but also a reversible degradation, for example an improvement of the state of health of the battery linked to desulphation of an electrochemical or lead-acid battery.

The electrical parameters used to analyze the state of health of a battery can in particular be constituted by the impedance of the battery, at a predetermined frequency, its conductance or its resistance.

Figure 2:
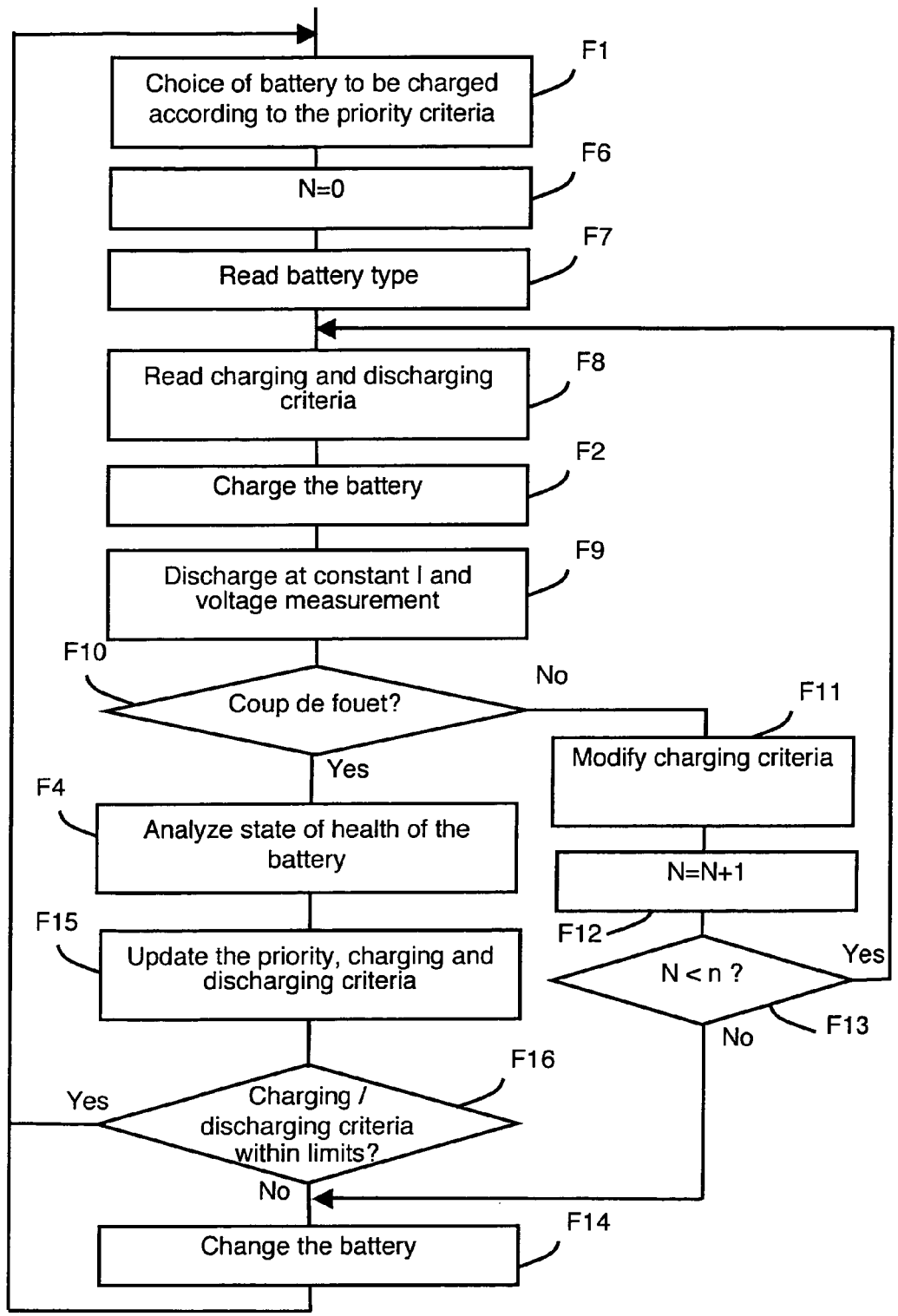
FIG. 2 represents another particular embodiment of a method for managing according to the invention.
Figure 3:
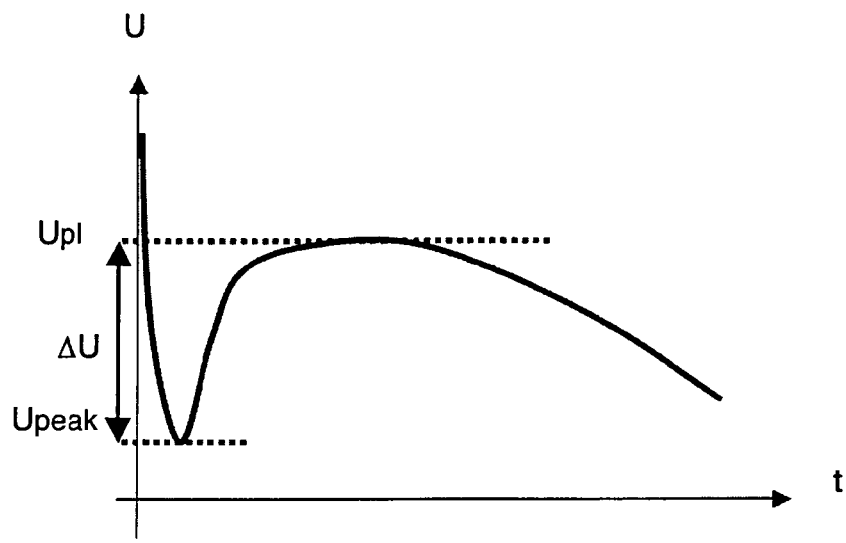
FIG. 3 represents the variations of the voltage at the terminals of a fully charged battery versus time during a partial discharge, highlighting the coup de fouet effect.

In a preferred embodiment, illustrated in FIGS. 2 and 3, the state of health of the battery is analyzed using measurement of the voltage at the battery terminals during a partial discharge of the charged battery, at constant current. Analysis more particularly uses the coup de fouet effect which occurs only at the beginning of partial discharging of a fully charged battery. The electrical parameters used are then the peak voltage Upeak, the plateau voltage Upl or the difference $\Delta U$ between the values of the peak voltage and the plateau voltage reached by the voltage at terminals of the selected battery, respectively during first and second partial discharging phases.

In the particular embodiment of FIG. 2, a quantity N is initially set to zero in a step F6 following step F1. Then, in steps F7, then F8, the type of the selected battery and the corresponding charging and discharging criteria, previously stored in the monitoring device, are respectively read. Charging of the selected battery is then performed in step F2, taking the previously read charging criteria into account. Measurement of the electrical parameters representative of the battery and designed to be used in step F4 comprises measurement of the voltage U at the terminals of the selected battery in a step F9, during which step the battery is subjected to partial discharging preferably at constant current. The measured voltage values are then analyzed during a step F10 to determine whether a coup de fouet effect has in fact taken place.

Figure 4:
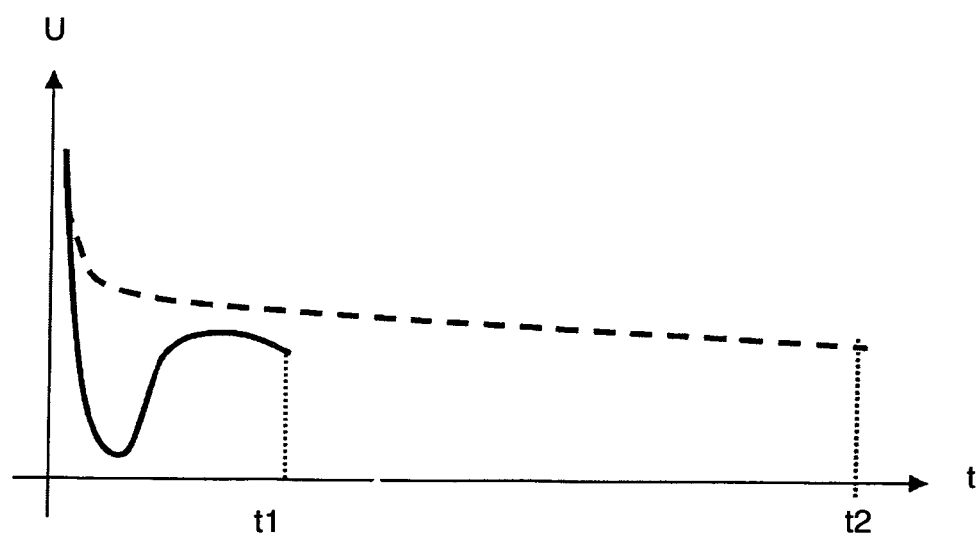
FIG. 4 illustrates the variations of the voltage at the terminals of a battery respectively after a full charge (in unbroken line) and after an incomplete charge (in broken line).

As represented in FIGS. 3 and 4 (in unbroken line), the coup de fouet effect is characterized, in known manner, by an abrupt drop of the voltage U at the terminals of the battery in a first phase of partial discharging of a fully charged battery, before the voltage increases again up to a plateau during a second phase. During the step F10, the peak voltage Upeak, corresponding to the minimum value of the voltage U during partial discharging, and the plateau voltage Upl, corresponding to the maximum value reached by the voltage U after the latter has risen again, are thus determined.

Discharging, and consequently voltage measuring, can be interrupted as soon as the coup de fouet effect occurs, i.e. at a time t1 (unbroken line curve of FIG. 4) at which the voltage again decreases after a voltage increase. In general, this phenomenon occurs very quickly when the battery is fully charged, which enables the discharging time to be reduced to the minimum. This time can for example be limited to a few minutes. Moreover, discharging is automatically interrupted at a time t2, after a preset duration, in order not to penalize the user if the battery has not been fully charged (broken line curve of FIG. 4) during step F2.

If the coup de fouet effect is ascertained (Yes output of F10), the analysis of the state of health of the battery is performed in step F4, taking account of the values of the peak voltage Upeak and/or of the plateau voltage Upl and/or of the difference $\Delta U$ between these two values ($\Delta U=Upl-Upeak$).

If there is no coup de fouet effect at time t2, corresponding to an incomplete charge of the battery (No output of F10), the charging criteria can be modified, in a step F11, before returning to step F8 to complete charging of the battery. In the particular embodiment illustrated in FIG. 2, the quantity N is then incremented (N=N+1) in a step F12 following step F11, and the new value of the quantity N is then compared with a preset threshold n in a step F13. If the quantity N is lower than the threshold n (Yes output of F13), the monitoring device loops back to step F8 to complete charging of the battery. Otherwise (No output of F13), i.e. if the battery is still not fully charged after n attempts, the battery is considered to be defective and the user is informed, in a step F14, that this battery has to be replaced ("change the battery").

Step F4 of analyzing the state of health of the battery is followed by a step F15 which, like step F5 of FIG. 1, comprises updating of the priority criteria, if necessary, according to the state of health of the battery. At the same time, the charging and discharging criteria can also be updated according to the state of health of the battery. Then, in a step F16, the updated charging and discharging criteria are compared with preset limits associated with the type of battery used and the application in which this battery is used. If the updated charging and discharging criteria remain within these limits (Yes output of F16), the monitoring device loops back to step F1 and selects another battery, according to the updated priority criteria. This new selected battery is, as before, charged before its state of health is analyzed and the priority criteria are re-updated, if necessary.

If the charging and discharging criteria are outside the limits (No output of F16), the battery is considered to be defective and the monitoring device goes on to step F14, informing the user that the battery has to be replaced before looping back to step F1.

Analysis of the state of health of the battery (step F4) can be performed by comparing the values of the electrical parameters (impedance, conductance, resistance, Upeak Uplateau or $\Delta U$) measured after full charging of the battery during the steps F3 or F9, with preset thresholds or by analyzing the evolution of these parameters.

Figure 5:
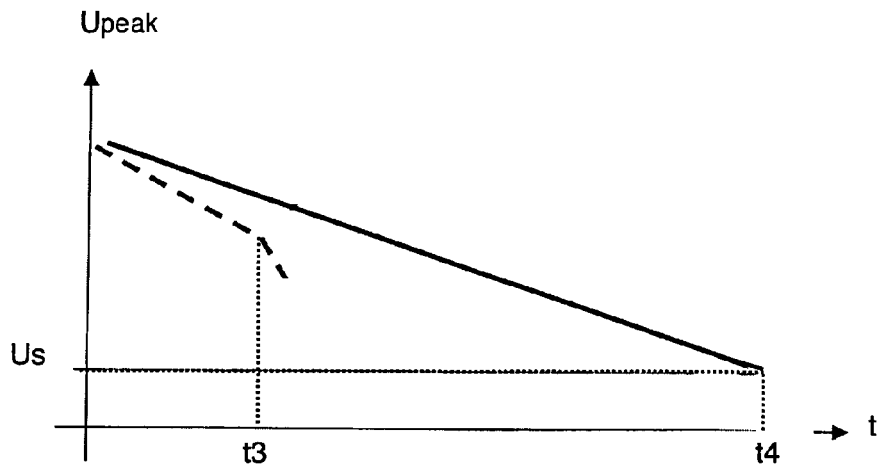
FIG. 5 schematically represents two ways of analyzing the state of health of a battery.

For example, as represented by the unbroken line curve of FIG. 5, in a first method for analyzing the state of health of a battery, the peak voltage Upeak is compared with a threshold Us. A degradation of the state of health of the battery imposing updating of the priority criteria and possibly of the charging and discharging criteria is detected when the peak voltage drops below the threshold Us at the time t4.

According to another method for analyzing, represented by the broken line curve of FIG. 5, the evolution of the peak voltage Upeak versus time is analyzed. Although the value of the peak voltage is higher than the threshold Us, the presence of a break in the slope, at the time t3, is considered to be representative of a deterioration of the state of health of the battery, requiring updating of the priority criteria and possibly of the charging and discharging criteria.

Figure 6:
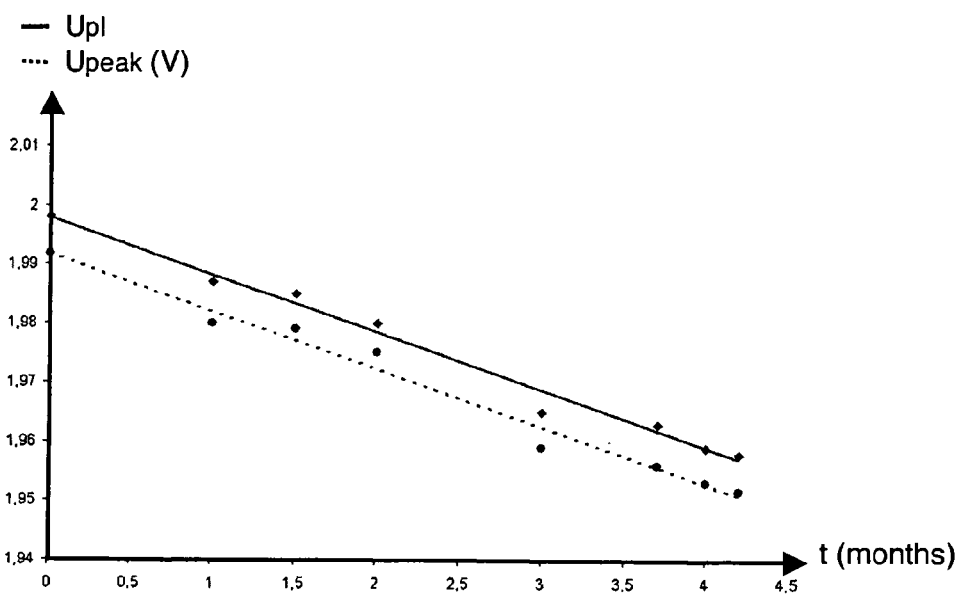
FIG. 6 illustrates the evolution of the peak voltage and plateau voltage of a lead-acid rechargeable battery.

For example, FIG. 6 illustrates the evolution versus time of the peak voltage Upeak and of the plateau voltage Upl of a first lead-acid rechargeable battery over a period of 4 months' use, variations respectively represented by a broken line and an unbroken line. This battery, constituted by a liquid electrolyte open electrochemical cell, has an initial capacity of 25 Ah. It is used with voltage thresholds of 1.75V on discharge and of 2.3V on charge, with charging and discharging currents of 2.5 A, for a charging or discharging time of 10 hours.

Figure 7:
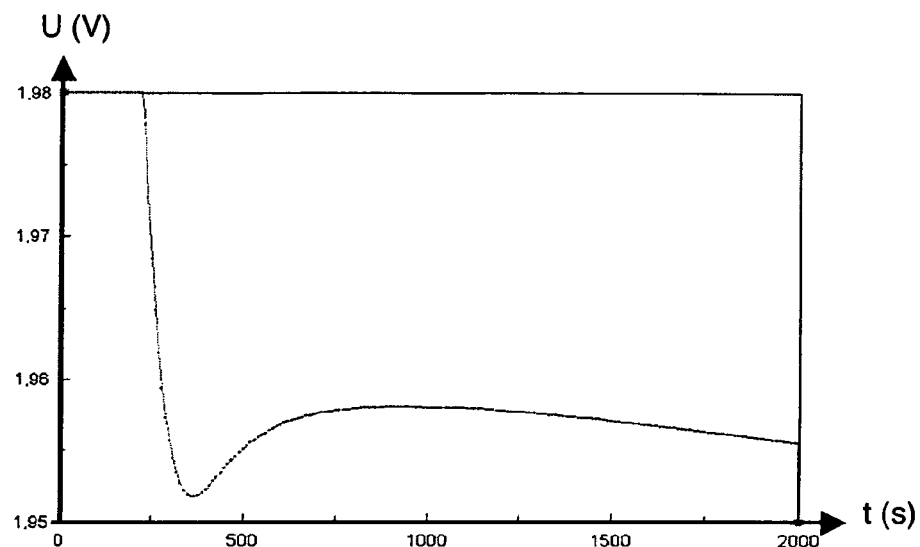
FIGS. 7 and 8 illustrate the variations, versus time, of the voltage U respectively at the terminals of first and second batteries during a partial discharge.

FIG. 7 illustrates the coup de fouet effect measured in a step F9 and observed in a step F10 (FIG. 2) after 4.2 months of operation of this first battery, i.e. on the $128^{th}$ day of operation. Comparison (analysis of step F4) of the peak voltage Upeak then obtained with the previously measured and recorded peak voltage curve, illustrated in FIG. 6, shows that there is no break in the evolution of the peak voltage. Moreover, the measured peak voltage remains higher than the threshold Us, which is for example 1.91V per cell (i.e. 11.46V for a battery comprising 6 cells). The priority criteria and the charging and discharging criteria are therefore not updated in step F15.

Figure 8:
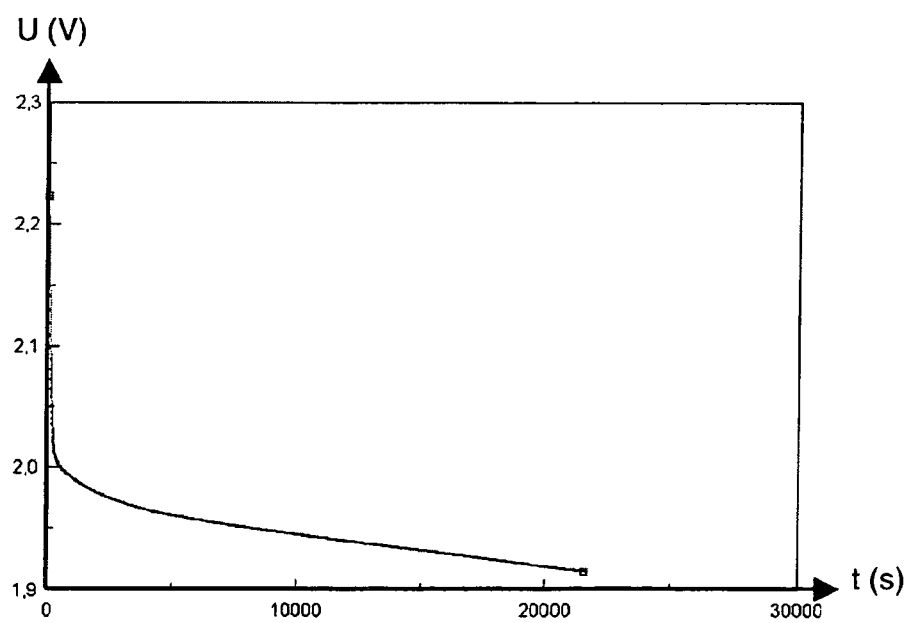

Measurement of the voltage U at the terminals of a second battery after 5 months of operation, during a step F9, is illustrated in FIG. 8. The battery involved is a lead-acid electrochemical cell with an initial capacity of 25 Ah. It is used with voltage thresholds of 1.75V on discharge and 2.4V on charge, with charging and discharging currents of 2.3 A, for a charging and discharging time of 10 hours. The absence of any coup de fouet phenomenon (No output of F10) leads to the modification of the charging and discharging criteria (step F11). For example, the charging voltage threshold is then increased and fixed at 2.45V and charging is modified to boost charge mode to complete charging of this battery (loop back to step F8).

Figure 9:
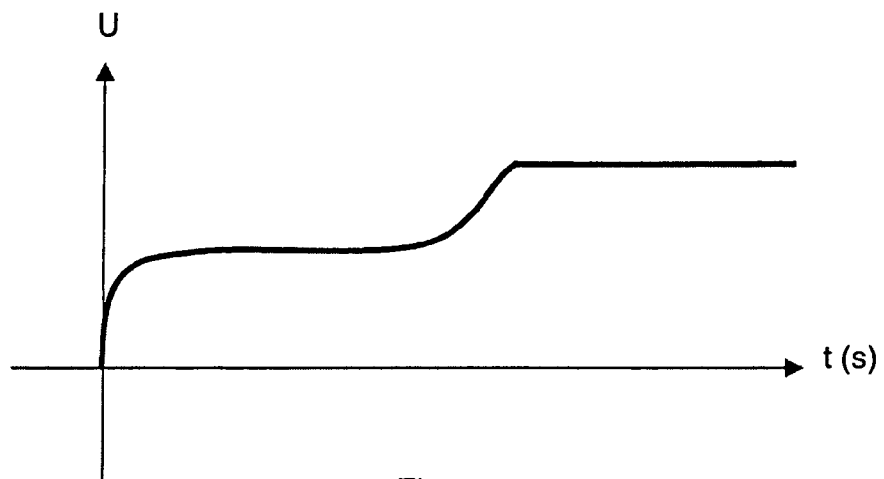
FIGS. 9 and 10 respectively illustrate the variations of the voltage U in the case of boost charging and the variations of the voltage U and of the current I in the case of pulsed current charging.
Figure 10:
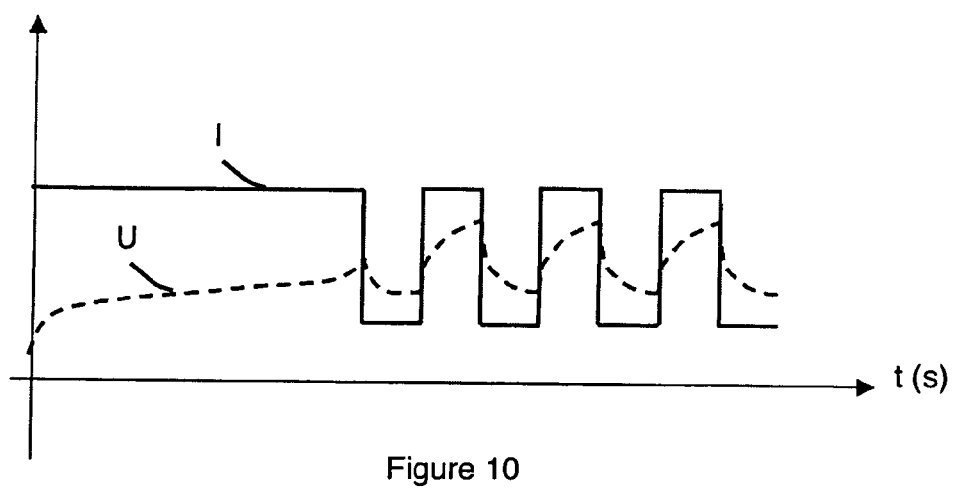

In a general manner, all types of charging or discharging can be used, taking account of the type of battery and of the type of application in which this battery is used. In known manner, the voltage at the terminals of the battery and/or the charging and discharging current are monitored and/or measured during charging or discharging. The charging and discharging criteria can be constituted by voltage and current time profiles, by charging and discharging current values, by charging and discharging voltage thresholds, or by supercharging coefficients to be applied at the end of charging. Different types of charging can also be used, possibly with a modification in the course of charging. For example, FIG. 9 illustrates the variations of the voltage U in the case of boost charging, with charging up to a threshold voltage, which can for example be 2.45V per cell, followed by charging at constant voltage (for example 2.45V per cell). The variations of the current I and of the voltage U in the case of high-frequency pulsed current charging are illustrated in FIG. 10, respectively by an unbroken line and a broken line.

Recharge of the selected battery (step F2) can be performed using the current available in the installation comprising the battery pool. This power may in particular be solar energy in photovoltaic installations or power supplied by a diesel generator in hybrid installations. In the case where the energy external to the pool of batteries is not available, in particular if recharging is performed at night in a photovoltaic installation, the selected battery can be recharged from other batteries of the pool. This last method is advantageous in so far as the power losses between batteries are negligible or very small. In the case of lead-acid batteries in particular, recharging of a selected battery by the other batteries only gives rise to a small power loss at the end of charging, due to the degassing phenomenon.

Furthermore, during the partial discharges performed to measure the state of health of the batteries, the power supplied by the tested battery can be directly distributed to the other batteries that are not fully charged so as not to penalize the user by this management system.

The term battery used in the above description covers both batteries and electrochemical cells.

Whereas in the prior art, the priority criteria are based on the state of charge of the batteries, without taking account of their state of health, according to the invention, it is therefore the state of health of the batteries that is taken into account. These characteristics are not similar. A fully charged battery can indeed be in good health as well as in bad health. The same applies to a fully discharged battery. In the prior art, the battery charged as the priority battery is the battery that is the most charged so as to rapidly provide a fully charged battery, whereas by means of the invention it is possible to charge the most degraded battery in priority and thereby to recharge more often the batteries which are in bad condition.

The management method according to the invention thus enables an intelligent management of a pool of batteries or of a pool of electrochemical cells to be performed, taking account of their state of health and of their evolution over time. The state of health of the pool can be continuously monitored and management of the battery pool can be continuous or punctual, in particular where rehabilitation of a pool of batteries is concerned.

The invention claimed is:

1. Method for managing a pool of rechargeable batteries comprising determination of priority criteria, charging of a battery selected according to the priority criteria, and measurement of electrical parameters representative of the selected battery, said method comprising analysis of a state of health of the selected battery according to said electrical parameters measured immediately after the selected battery has been fully charged, updating of the priority criteria according to the state of health of the selected battery, and selection of the next battery according to the updated priority criteria;

wherein the measurement of the electrical parameters of the selected battery comprises measurement of the voltage at the terminals of said battery during a partial discharge at constant current;

wherein the measurement of the electrical parameters comprises measurement of parameters representative of a coup de fouet effect during the partial discharge; and wherein the measurement of parameters representative of a coup de fouet effect comprises determination of the difference between the values of a peak voltage and of a plateau voltage reached by the voltage of the selected battery respectively during first and second phases of the partial discharge.

2. Method according to claim 1, wherein the analysis of the state of health of the selected battery comprises comparison of the electrical parameters of the selected battery, measured after said battery has been charged, with preset thresholds.

3. Method according to claim 1, wherein the analysis of the state of health of the selected battery comprises detection of a break in the evolution of the electrical parameters of the selected battery, measured during a preset period after the battery has been charged.

4. Method according to claim 1, wherein the measurement of the electrical parameters of the selected battery comprises measurement of the impedance of said battery.

5. Method according to claim 1, wherein the measurement of the electrical parameters of the selected battery comprises measurement of the conductance of said battery.

6. Method according to claim 1, wherein the measurement of the electrical parameters of the selected battery comprises measurement of the resistance of said battery.

7. Method according to claim 1, wherein the measurement of parameters representative of a coup de fouet effect comprises determination of a peak voltage during the partial discharge.

8. Method according to claim 1, wherein the measurement of parameters representative of a coup de fouet effect comprises determination of a plateau voltage during the partial discharge.

9. Method according to claim 1, comprising modification of the charging criteria of the selected battery in the absence of coup de fouet effect during the partial discharge.

\* \* \* \* \*